(12) United States Patent
Bedell et al.

(10) Patent No.: US 8,247,261 B2
(45) Date of Patent: Aug. 21, 2012

(54) THIN SUBSTRATE FABRICATION USING STRESS-INDUCED SUBSTRATE SPALLING

(75) Inventors: Stephen W. Bedell, Armonk, NY (US); Keith E. Fogel, Armonk, NY (US); Paul A. Lauro, Armonk, NY (US); Devendra Sadana, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 12/784,688

(22) Filed: May 21, 2010

(65) Prior Publication Data
US 2010/0311250 A1 Dec. 9, 2010

Related U.S. Application Data

(60) Provisional application No. 61/185,247, filed on Jun. 9, 2009.

(51) Int. Cl.
*H01L 21/463* (2006.01)
(52) U.S. Cl. .......... 438/73; 438/459; 438/492; 438/977; 136/252; 257/E21.214; 257/E21.093; 257/E21.103; 257/E25.007
(58) Field of Classification Search .................. 438/57, 438/455, 459, 492, 977; 257/E21.093, E21.103, 257/E21.214, E25.007; 136/252
See application file for complete search history.

(56) References Cited

U.S. PATENT DOCUMENTS

| | | | |
|---|---|---|---|
| 4,855,012 A | 8/1989 | Sumi | |
| 5,000,816 A | 3/1991 | Seki et al. | |
| 6,452,091 B1 | 9/2002 | Nagakawa et al. | |
| 6,682,990 B1 | 1/2004 | Iwane et al. | |
| 6,802,926 B2 | 10/2004 | Mizutani et al. | |
| 6,887,650 B2 | 5/2005 | Shimoda et al. | |
| 2001/0055854 A1* | 12/2001 | Nishida et al. | 438/455 |
| 2007/0141803 A1* | 6/2007 | Boussagol et al. | 438/455 |
| 2008/0268615 A1* | 10/2008 | Allibert et al. | 438/455 |
| 2010/0087045 A1* | 4/2010 | Shimomura et al. | 438/458 |

* cited by examiner

*Primary Examiner* — Mary Wilczewski
*Assistant Examiner* — Toniae Thomas
(74) *Attorney, Agent, or Firm* — Robert J. Eichelburg; The Law Offices of Robert J. Eichelburg (57) ABSTRACT

A method for manufacturing a thin film direct bandgap semiconductor active solar cell device comprises providing a source substrate having a surface and disposing on the surface a stress layer having a stress layer surface area in contact with and bonded to the surface of the source substrate. Operatively associating a handle foil with the stress layer and applying force to the handle foil separates the stress layer from the source substrate, and leaves a portion of the source substrate on the stress layer surface substantially corresponding to the area in contact with the surface of the source substrate. The portion is less thick than the source layer. The stress layer thickness is below that which results in spontaneous spalling of the source substrate. The source substrate may comprise an inorganic single crystal or polycrystalline material such as Si, Ge, GaAs, SiC, sapphire, or GaN. In one embodiment the stress layer comprises a flexible material.

8 Claims, 6 Drawing Sheets

THIN SUBSTRATE FABRICATION USING STRESS-INDUCED SUBSTRATE SPALLING

RELATED APPLICATION

The present application is a Non-Provisional application which claims the benefits of and is based on Provisional Application Ser. No. 61/185,247 filed on Jun. 9, 2009, the contents of which are incorporated herein by reference in their entirety.

FIELD OF THE INVENTION

The field of the invention is photovoltaic devices such as solar cells, and particularly substrate fabrication for photovoltaic devices using stress induced substrate spalling.

BACKGROUND OF THE INVENTION AND RELATED ART

The field of photovoltaics (PVs) is primarily concerned with maximizing the conversion efficiency of photon energy into electrical energy under the constraint of minimum cost. The resulting figure of merit of a given photovoltaic technology is therefore cost per Watt. Therefore, some of the driving forces for innovation in PVs comprise increasing the efficiency of the solar cell device (or system), decreasing materials costs, or decreasing processing costs. Additionally, the industry is looking to increase the versatility of photovoltaic (PV) materials to address other market needs. An example of this is integrating flexible solar cells into architectural or structural materials or other non-standard solar panel applications. Although efforts have been made to develop this technology, the materials used do not permit high efficiency energy conversion. For these reasons, there remains a need for a method of fabricating low-cost, high efficiency PV substrates that can be used to 1) increase the cost per Watt value of conventional PV technology or 2) permit fabrication of novel, high-efficiency PV materials that are flexible and can be used to produce new PV products.

The related art describes various methods for producing thin film materials used in the manufacture of PVs, or similar devices by various methods such as peeling, e.g., Shimoda, et al., U.S. Pat. No. 6,887,650; Iwane, et al., U.S. Pat. No. 6,682,990; Mizutani, et al., U.S. Pat. No. 6,802,026; Nagakawa, et al., U.S. Pat. No. 6,452,091; Seki et al. U.S. Pat. No. 5,000,816; and Sumi., U.S. Pat. No. 4,855,012.

A different technique has been used recently [F. Dross et al., *Appl. Phys. A*, 89 (2007) p. 149] to fabricate a thin single-crystal Si layer from a thicker source substrate using the "spontaneous" spalling resulting from thick Ag and Al bi-layers and high temperature annealing to create tensile strain through thermal expansion mismatch. The problem with this approach is twofold; first, the high temperature step limits the ability to integrate partially (or fully) processed PV devices (devices with formed dopant junctions or metallization) with the spalling process (due to excessive dopant diffusion and incompatibility of most metals with high temperature) and adds cost to the materials; and second, spontaneous spalling leads to poorly controlled fracture, physical curling of the stressor layer/exfoliated semiconductor layer combination, and the requirement for very thick stressor layers to self-initiate fracture in the substrate.

SUMMARY OF THE INVENTION

The present invention comprises processes, structures or articles of manufacture, materials, compounds, and compositions of matter, that address these needs to not only provide advantages over the related art, but also to substantially obviate one or more of the foregoing and other limitations and disadvantages of the related art by providing a method of fabricating low-cost, high efficiency PV substrates that can be used to increase the cost per Watt value of conventional PV technology or permit fabrication of novel, high-efficiency PV materials that are flexible and can be used to produce new PV products.

Not only do the written description, claims, abstract of the disclosure, and the drawings that follow set forth various features, objectives, and advantages of the invention and how they may be realized and obtained, but these features, objectives, and advantages will also become apparent by practicing the invention.

To achieve these and other advantages, and in accordance with the purpose of the invention as embodied and broadly described herein, the invention not only comprises thin, high efficiency, low cost PV substrate fabrication processes that employ stress induced substrate spalling, but also, thin substrate structures or articles of manufacture produced by this process, as well as materials, compounds, and compositions of matter used in the process and article of manufacture. These PV substrates increase the value on a cost per Watt basis of conventional PV technology and/or permit fabrication of novel, high-efficiency PV materials that are flexible and can be used to produce new PV products.

The present invention provides a method for fabricating a thin (less than 100 um thick) semiconductor from a thicker source substrate using a new approach to controlled surface layer removal. Specifically, the present invention describes a method of controlling surface layer removal that can occur through a process known as substrate spalling. In substrate spalling, a layer of metal under tensile strain is deposited on the surface of a substrate. If the stressor layer is made thick enough, the stress at the edge of the stressor layer/source substrate interface, e.g., metal layer/substrate interface exceeds the fracture strength of the substrate and a fracture propagates into the source substrate and propagates at a distance below, and parallel to, the surface of the source substrate. Under the proper mechanical conditions (brittle substrate, tensile strain in stressor layer), the fracture will not propagate through the source substrate but rather it will propagate parallel to the surface of the stressor layer/source substrate interface and a portion of the source substrate surface will "peel" off as a surface layer of the source substrate while remaining attached to the stressor layer.

One embodiment of the invention comprises a PV precursor single crystal or polycrystalline substrate having a surface with a stressor layer operatively associated with the surface. The stressor layer comprises a stressor layer surface in contact with the surface of the substrate, extending in a direction away from the surface of the substrate, and is operatively associated with a handle layer disposed on the stressor layer to move in a direction away from the surface of the substrate. Pulling the handle layer away from the substrate removes the stressor layer. A portion of the substrate within the vicinity of the surface of the substrate is removed from the substrate by remaining on the surface of the stressor layer as the stressor layer is pulled away from the substrate, i.e., the portion is disposed on the stressor layer surface.

BRIEF DESCRIPTION OF THE DRAWINGS

The accompanying drawings also set out the invention and are incorporated in and constitute a part of the disclosure along with this specification and are included to illustrate various embodiments of the invention and together with this written description also serve to explain the principles of the invention. These drawings are, however, not necessarily drawn to scale.

In the drawings.

DETAILED DESCRIPTION

To achieve these and other advantages, and in accordance with the purpose of this invention as embodied and broadly described herein, the following detailed embodiments can be embodied in various forms.

The specific processes, materials compounds, compositions, and structural details set out herein not only comprise a basis for the claims and a basis for teaching one skilled in the art to employ the present invention in any novel and useful way, but also provide a description of how to make and use this invention.

The invention in one embodiment is a light weight and portable photovoltaic device resistant to humidity, heat, and other outdoor environmental conditions and comprises a thin film direct or indirect bandgap semiconductor active solar cell device (thin film device) positioned on a flexible plastic, i.e., a flexible polymeric material, or other flexible material. This thin film device is further characterized as comprising a single crystal or polycrystalline material, alloy, or compound (any orientation) layer less than 20 microns thick (thin layer) having the active solar cell device deposited on it using the thin layer as a substrate. In another embodiment, the thin layer can also comprise the semiconductor active solar cell. Alternatively the entire solar cell structure is fabricated prior to bonding followed by transferring the solar cell structure to the flexible plastic carrier without need for further semiconductor deposition.

Flexibility is provided by a total semiconductor thickness less than about 20 um (microns) sandwiched between flexible plastic encapsulation layers resistant to humidity, dust, or abrasion. The relationship between maximum flexibility (minimum radius of curvature before fracture) and the thickness of the semiconductor layers (either single semiconductor layer or multiple semiconductor layers that are mechanically coupled) can be estimated using mechanical models (A. W. Blakers and T. Armour, *Solar Energy Materials and Solar Cells*, Vol. 93, 2009, p. 1440). The flexible plastic encapsulation layers can include the flexible plastic used to transfer the thin semiconductor layer (thin layer) Puncture resistance is provided by device redundancy: combining multiple cells in parallel and series configuration such that loss of cells damaged by impact events results in low power loss by the overall array. Low cost is provided by the use of very thin layers of semiconductor and the use of low cost processing.

The invented photovoltaic system is enabled using a breakthrough technique for low-cost layer transfer. This technique called "controlled spalling" requires deposition of only thin low-cost stressor layers (metal layer 6 and optional adhesion layer 4) on the source substrate 2 and layer transfer can be achieved by simply pulling the surface of the source substrate 2 onto a flexible substrate 8 or handle layer.

Figure 1:
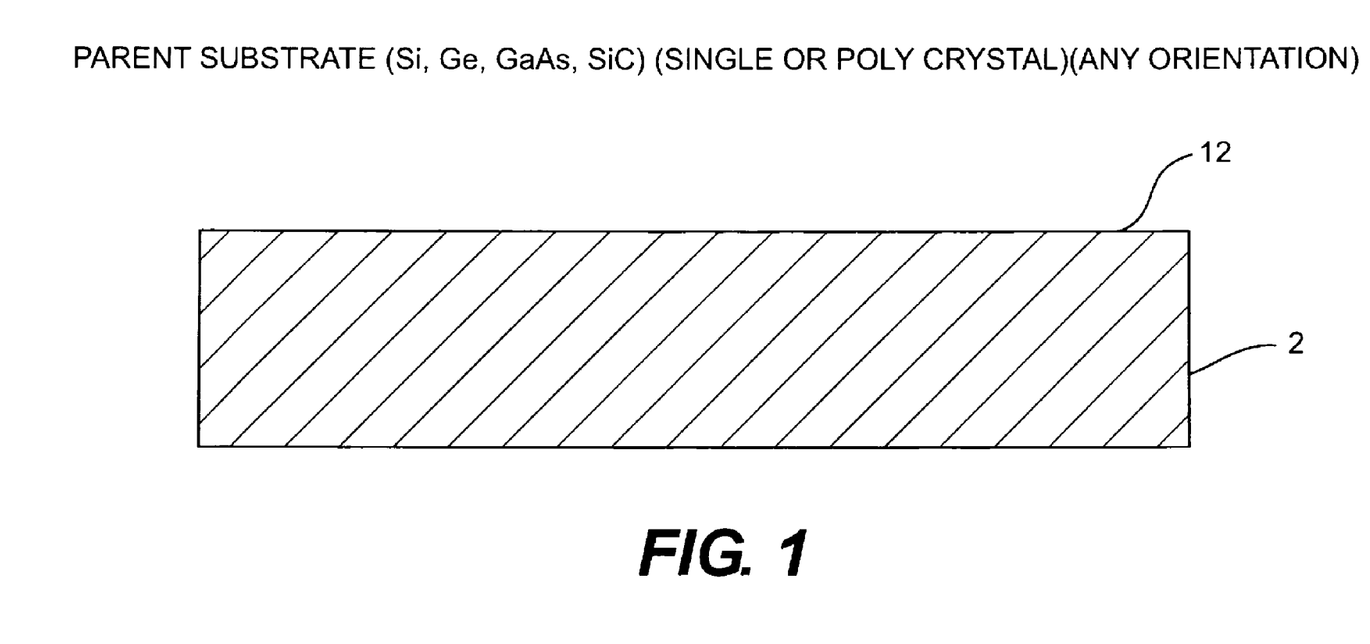
FIG. 1 comprises a side elevation in cross section of a source substrate comprising an inorganic material, alloy, or compound (e.g., Si, Ge, GaAs, SiC, sapphire, GaN) which is a single crystal or polycrystalline material, alloy, or compound (any orientation).
Figure 2:
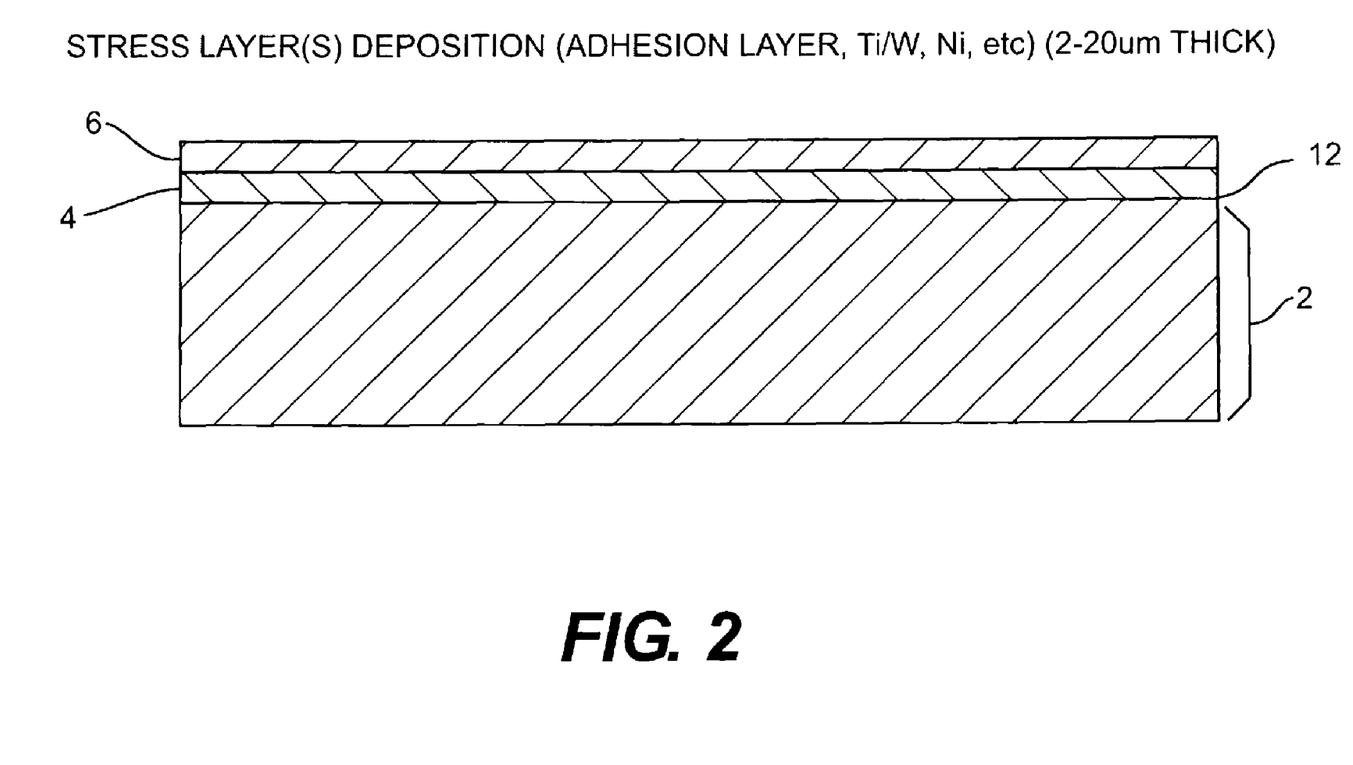
FIG. 2 comprises a side elevation in cross section of a deposited stress layer or layers, extending from and operatively associated with, i.e., glued, adhered, or bonded to the source substrate, where the stress layer or layers comprise at least one of an (optional) adhesion layer comprising Ti/W, Ti, Cr, Ni, and the like, about 5 nm (nanometers) to about 500 nm thick, adhered to said source substrate followed by at least one of a stress-containing layer comprising for example Ni, Cr, Fe, and the like, about 1 um (micron) to about 50 um thick.

In one embodiment the "handle" layer 8 comprises means different than the stressor layer (layer 6) to initiate and propagate the spalling process. This allows for better fracture control and more versatility in handling the exfoliated semiconductor layer 14. Metal layer 4 is optional and serves as an adhesion layer. Certain metals such as Cr, Ti, and other metals and alloys have excellent adhesion properties and can be used in situations where the stressor layer has poor adhesion to the surface of the source substrate 2. Referring to FIGS. 1-2, one or more metal layers 4 and 6 are deposited on a source substrate 2 (e.g., single crystal semiconductor) to a thickness that is less than that required for spontaneous spalling (at room temperature, about 20° C.), but thick enough to permit mechanically assisted spalling using an external load. An example of an external loading technique that successfully leads to controlled spalling is to adhere a foil 8 (handle layer) to the surface 10 of the metal 6 (i.e., tape foil 8 or handle layer 8 is operatively associated with the metallurgically bonded layers 4, 6) to form a metal/source substrate, followed by pulling the foil from the substrate to remove the thin surface layer from the source substrate as well. The foil 8 (i.e., handle layer 8) is required to be flexible, and should have a minimum radius of curvature of less than 30 cm. If the foil layer 8 is too rigid, the spalling process is compromised. A preferred material for tape foil 8 comprises a polyimide.

The process and article of manufacture of the present invention have distinct advantages over the spontaneous spalling of the prior art in four respects; first, the entire process can be completed at room temperature allowing for the removal of completed PV devices; second, the lower thermal budget reduces energy costs to produce the thin substrate; third, spalling can be performed at a time and in a manner of convenience rather than spontaneously, allowing more versatility in processing steps; and fourth, the thickness of the removed substrate comprising the thin surface layer 14 by can be controlled by adjusting the thickness of the stressor layer. By contrast, in the spontaneous process the stressor layer must be thick enough to induce self-initiation, which does not allow for thinner stressor layers that would produce thinner removed layer substrates such as surface layer 14.

In one aspect, the thin stressor layer or layers, singly, or in combination are used at a thickness below that which results in the spontaneous spalling of the source substrate 2. The condition that results in spontaneous spalling is related to the simultaneous combination of the stressor layer 6 thickness value and stress value, as well as the mechanical properties of the source substrate 2. At a given stressor layer 6 thickness value, there will be a stress value above which spalling will occur spontaneously. Likewise, at a given stressor layer 6 stress value, there will be a thickness value above which spalling will occur spontaneously. An approximate guide for the stressor layer thickness value at which spalling becomes possible for the case where the stressor layer 6 is substantially comprised of tensile strained Ni is given by the relation $t^* = [(2.5 \times 10^6)(K_{IC}^{3/2})]/\sigma^2$, where $t^*$ is the thickness value (in units of microns, um) of stressor layer 6 at which controlled spalling becomes possible, $K_{IC}$ is the fracture toughness value of the source substrate 2 (in units of MPa·m$^{1/2}$), and $\sigma$ is the magnitude of the stress value in stressor layer 6 (in units of MPa, or megapascals). If the stressor layer thickness is greater than the value given by $t^*$ by approximately 50%, then spontaneous spalling may occur. In another aspect, the thickness may be anywhere from about 1 um to about 50 um, or from about 3 um to about 30 um, or about 4 um to about 20 um thick. The thin stressor layer or layers comprise metal layer 6 as presently illustrated, but this comprises only one embodiment of this aspect of the invention. Other embodiments include multiple thin stressor layers, e.g., up to about three, or about four, or about five metal layers, or more, provided that when taken together, they substantially fall within the thickness limits set out above. As noted before, in one embodiment, the thin stressor layer or layers comprise a low-cost thin stressor layer or layers.

Figure 4:
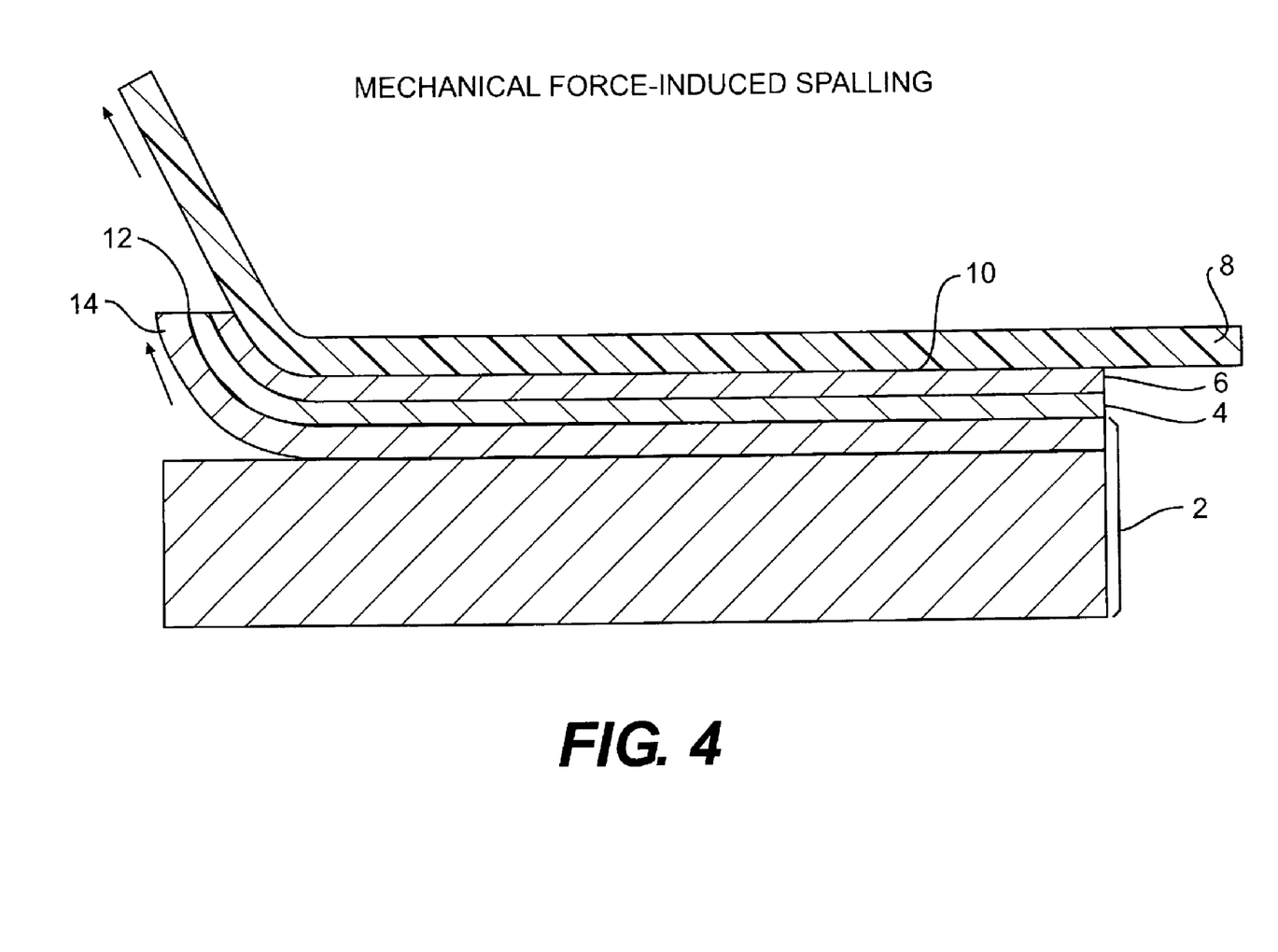
FIG. 4 comprises a side elevation in cross section showing mechanical force-induced spalling of the source substrate by lifting the stress layer or layers by means of the attach handle foil according to the present invention.
Figure 5:
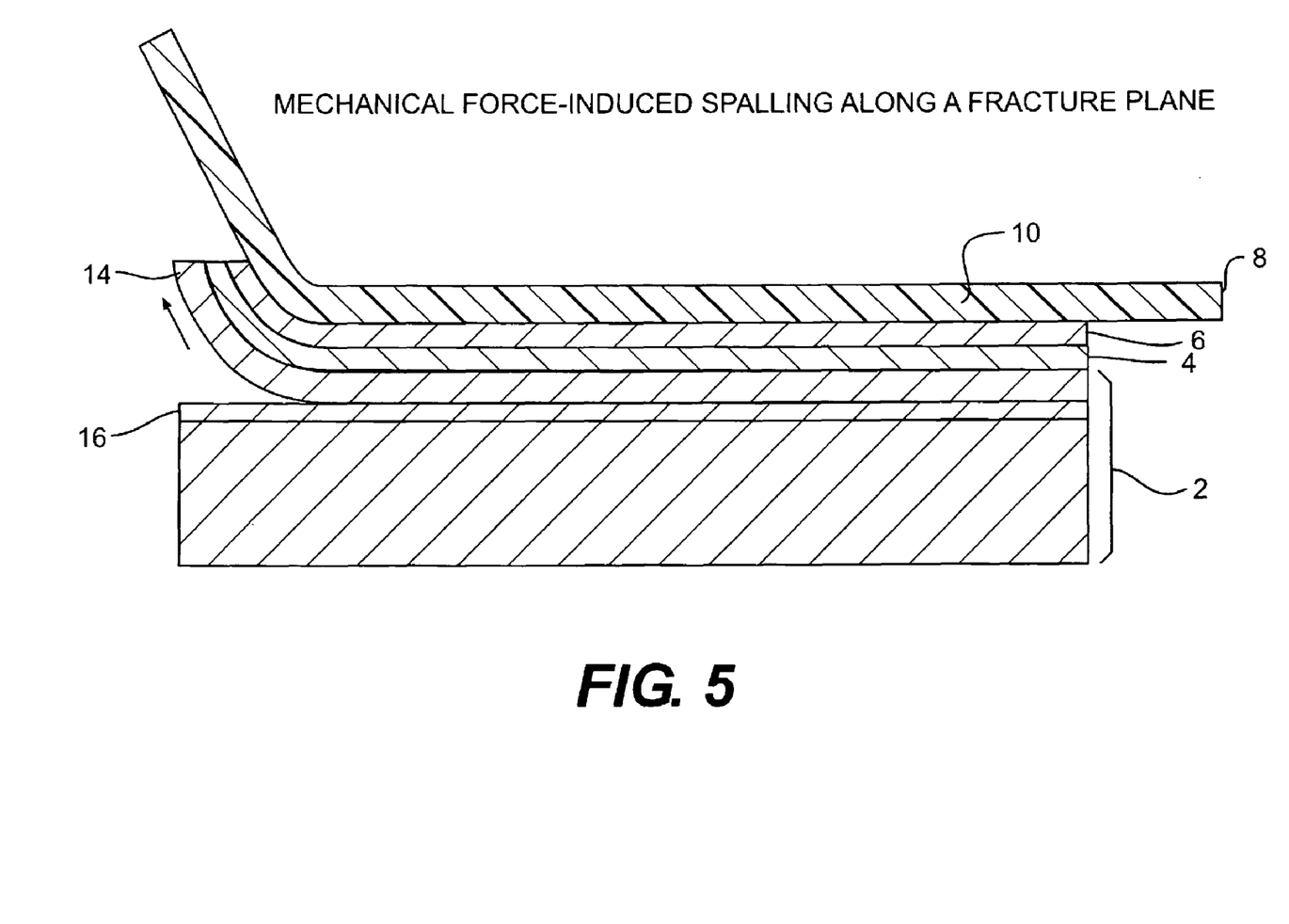
FIG. 5 comprises a side elevation in cross section showing mechanical force-induced spalling of the source substrate along a fracture plane by lifting the stress layer or layers by means of the attach handle foil according to the present invention, where the fracture plane is embedded in the source substrate and extends from the source substrate toward the stress layer and the attach handle foil.

Selection of the thin stressor layer or layers does not have to be based on the difference between the coefficient of thermal expansion of the stressor layer or layers and the coefficient of thermal expansion of the source substrate for promoting spontaneous spalling as in the prior art, where spalling is effected by cooling the structure from an elevated temperature (about 900° C.) to a lower temperature. The present invention does not rely on spontaneous spalling but rather the use of mechanical force, and controlled fracture at substantially room temperature (about 20° C.) to separate the thin stressor layer or layers from the source substrate and remove a thin surface region of controllable thickness from the source substrate. The thickness of the exfoliated semiconductor layer 14 in FIG. 4 from source substrate 2 is roughly twice the thickness value of the combined thickness values of stressor layer 6 and optional adhesion layer 4. By controlling the amount of strain in the stressor layer 6, the operable thickness value of stressor layer 6 ($t^*$) can be chosen to remove a controlled thickness of exfoliated semiconductor layer 14. For example, if an exfoliated semiconductor layer 14 thickness value of Si<111> was desired to be approximately 8 um, then a Ni stressor layer 6 would need to be approximately 4 um thick. By using the $K_{IC}$ value for Si<111> (0.82 MPa·m$^{1/2}$) the expression for $t^*$ above can be used to calculate that a stress value of ~700 MPa is required. Although the origin of the stress in the stressor layer 6 is intrinsic (originating from microstructure) and not due to coefficient of thermal expansion (CTE) stress, heating stressor layer 6 often has the effect of increasing the stress value. This is due to microstructural changes within stressor layer 6 that occur upon annealing and is irreversible. Localized heating is therefore contemplated to initiate fracture in the periphery of the area to be layer transferred. In other words, spontaneous spalling can be made to occur in small, selected regions to help initiate fracture, e.g., by increasing the thickness of the stress layer in these small selected regions. Localized heating can be performed using a laser, remote induction heating, or direct contact heating.

Figure 3:
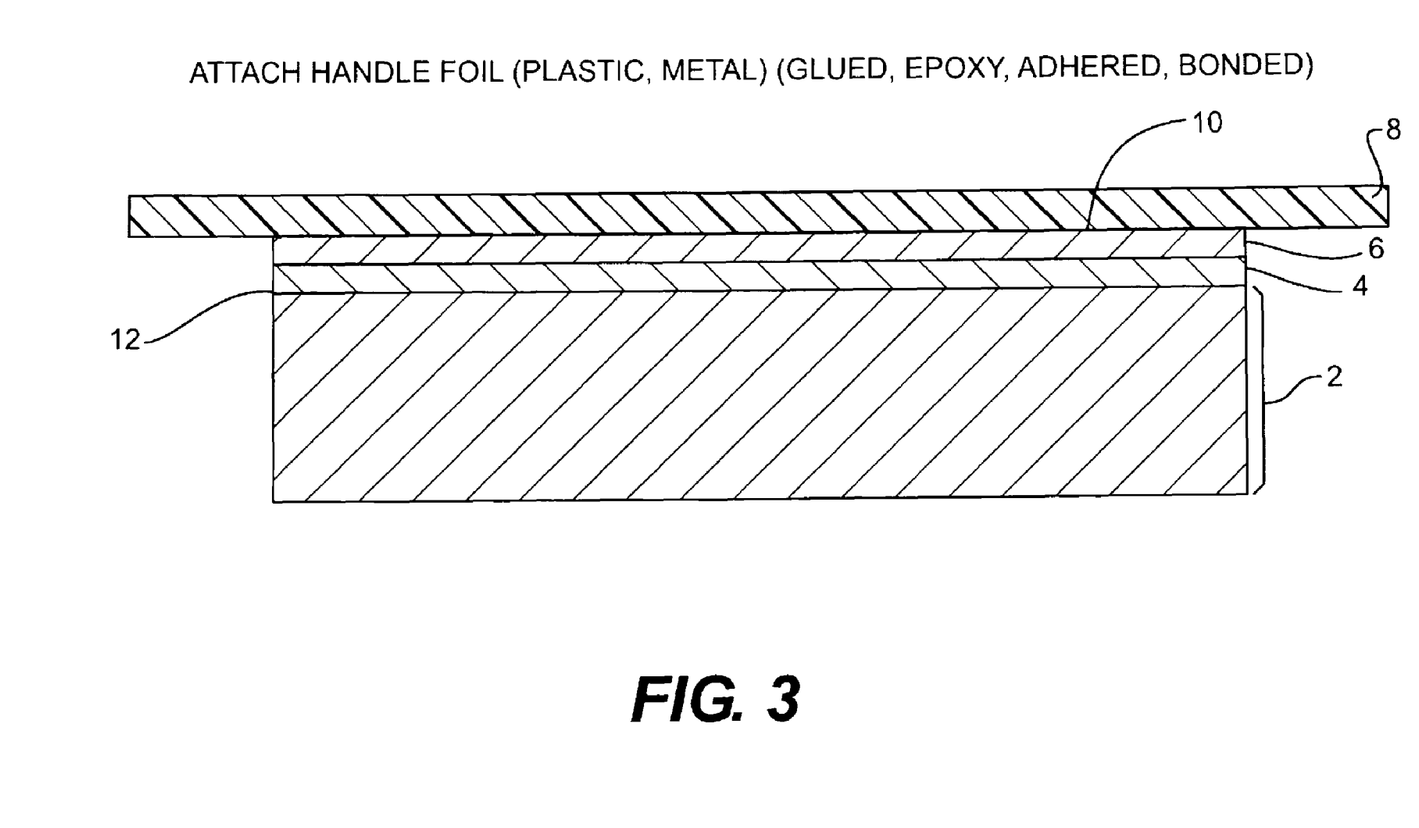
FIG. 3 comprises a side elevation in cross section of an attach handle foil comprising a plastic or metal foil, extending from and operatively associated with, i.e., glued, adhered, or bonded to a stress layer of the invention, where the glue, adhesion agent or bonding agent and the like may comprise an epoxy resin, thermocompression bonding or art-known equivalent.

We have demonstrated controlled layer transfer of various source layers including Si, Ge, and GaAs directly onto a flexible membrane (handle layer 8 in FIG. 3) such as polyimide. Other art-known organic polymeric materials can also be used for handle layer 8, such as polyethylene terephthalae (PET), polycarbonates, ethylene polymers and copolymers, and fluorocarbon polymers and copolymers. This technique has the capability of transferring any processed semiconductor layers onto arbitrary substrates at room temperature in a manner that does not add significantly to the overall fabrication cost. Because the source substrate 2 can be re-processed and reused, this opens the door to a lower cost pathway to high-efficiency cells based on crystalline Si or III-V semiconductors. The use of this new technique to produce high-efficiency solar cells on highly flexible films combined with a module-level integration scheme that will optimize ruggedness and permit discrete cell failure makes this approach ideal.

Another embodiment of this invention comprises creating a fracture plane 16 which we also refer to as a strained layer below the surface 12 of the source substrate 2. By creating the fracture plane 16 (a region with weaker bonding than the source substrate), the spalling has been observed to occur preferentially within the fracture plane 16. This results in well-defined thickness of the exfoliated semiconductor layer 14, smoother fractured surfaces, improved reusability of the source substrate 2 and a convenient method of exfoliating pre-processed layers in a well-controlled manner. Examples of fracture planes 16 comprise buried strained epitaxial layers (strained layers) optionally weakened with hydrogen exposure, ion-implanted regions, or deposited layer interfaces obtained by processes well known in the art.

An example of a buried strained epitaxial layer 16 comprises the growth of a single-crystal SiGe alloy layer on the surface of a Si substrate, followed by the growth of a Si capping layer. If this structure is exposed to hydrogen plasma, the hydrogen collects at the strained SiGe/Si interfaces and weakens the bonding at those interfaces. The present inventors have successfully demonstrated preferential fracture along buried, strained, and hydrogenated (using plasma exposure) SiGe alloy layers grown on Si substrates. Additionally, the incorporation of boron in these SiGe alloy layers improves the efficiency of hydrogen trapping at the strained layer interface 16 which we also refer to as a fracture plane.

Accordingly we grow a strained layer or fracture plane 16 on a crystalline source substrate 2 (using CVD, MBE, or even evaporation). As noted, this can comprise a strained layer or fracture plane 16 comprising SiGe on Si (the SiGe can be boron doped or undoped), followed by growing a thick Si cap layer (on top of the strained layer or fracture plane 16) that will be transferred, then subject the source substrate 2 obtained to a hydrogen source capable of transporting hydrogen into it (hot acid, ion implant, plasma exposure, hot wire hydrogenation, and the like). The hydrogen attacks the subsurface strained bonds in the region of the strained layer or fracture plane interfaces, e.g., the interface between source substrate 2 and strained layer or fracture plane 16 thereby weakening the strained layer 16/source substrate 2 interface. When we apply the controlled spalling technique described above to layer 6 and/or 4, initiation, peeling, fracture occurs with atomic scale precision at the weakened strained layer 16/source substrate 2 interface. Because the material is weakened in the strained layer or fracture plane 16, fracture is easier (less force) and the metal layers 4, and/or 6 can be thinner (less than about 3 um—thus less costly). The idea is that we grow the full solar cell structure (The Processed Region of FIG. 6) over the strained layer or fracture plane 16, and simply peel it off, and we can reuse the source substrate 2.

Figure 6:
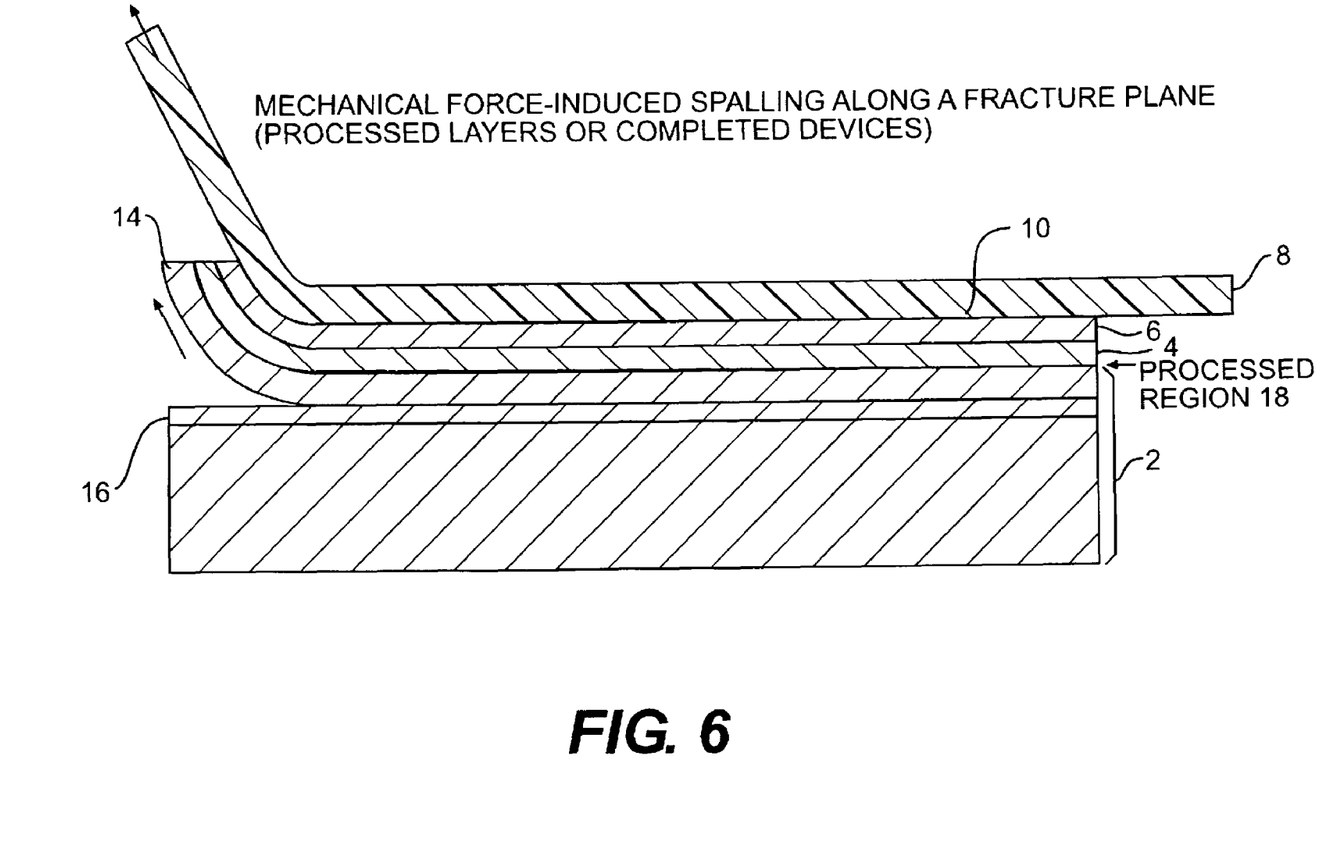
FIG. 6 comprises a side elevation in cross section showing mechanical force-induced spalling of the source substrate along a fracture plane where the fracture plane comprises processed layers or completed devices. The force induced spalling is induced by lifting the stress layer or layers by means of the attach handle foil according to the present invention The detailed description that follows further explains embodiments of the invention, and the advantages and features of the invention by way of examples and with reference to the drawings.

In FIG. 6, region 18 comprises a Processed Region or completed device such as formed p/n junctions, metal contacts, diodes, transistors, resistors and the like. More broadly, a Processed Region comprises a region that has been altered from its initial state by doping, heating, or reacting with other elements, whereas a completed device comprises a collection of Processed Regions capable of performing electrical operations.

An example of deposited layer interface 16 comprises single-or poly-crystalline layers deposited using evaporation, sputtering, molecular beam epitaxy, or chemical vapor deposition techniques such as UHVCVD, MOCVD, RPCVD or APCVD, performed in such a manner that the interface between the substrate 2 and the deposited layer 16 is imperfect. One such example is the growth or deposition of Si onto a Si substrate. Conditions may be chosen to leave a measurable quantity of residual oxygen, or carbon (or both) at the interface of substrate 2 and layer 16, which can serve as the location of preferred fracture. Hydrogenation can further weaken these interfaces as well.

The basic concept that differentiates the present invention from prior art substrate spalling is that the prior art describes "spontaneous spalling"; namely, spalling obtained by the deposition of thick layers. This type of spalling requires large stress, mostly due to the initiation and propagation of fracture to be driven by the metal layer deposited on the source substrate that occurs when cooling the structure down from 900 C. Because of the use of thick layers and a lot of stress, there is little control over the minimum thickness of the transferred layers.

What we describe here is the deposition of much thinner metal layers on the source substrate 2 (over a factor of about 10× thinner than the prior art) at low temperature (less than about 300° C., typically about 100° C.), such that there is no spalling (film peeling) at this stage. Then we create a fracture initiation region (laser scribe near wafer edge, e.g., the edge of the device in FIG. 2 between the source substrate 2 and the thin surface layer 14 or any technique that creates a small localized surface perturbation that acts as a fracture initiation site), followed by bonding an adherent layer, e.g., foil 8 (i.e., handle layer 8) to the surface 10 of the metal layer, such as layer 6, of the metal layer/source substrate structure, and "peel" the layer 6 (and optionally layer 4 in combination with layer 6) off by applying mechanical force to the adherent layer 8 (or transfer medium). In practice we have used polyimide tape as layer 8 adhered to layer 6 and peel off the layers 14, 6 (and optionally layer 4 in combination with layer 6). We have also demonstrated that employing a temporary adhesion layer like water, or a gel between the surface 10 and a flexible membrane 8 (i.e., handle layer 8) followed by applying a force to flexible membrane 8 away from source substrate 2 can remove the surface layers 14, 6 (and optionally layer 4 in combination with layer 6), and 8 and they are free standing (but coiled).

We apply the mechanical force to the layers 6 (and optionally layer 4 in combination with layer 6) in a direction away from the source substrate 2 at an angle from about one degree up to about 180° to the plane of the surface of source substrate 2 that is common with layer 6 (and optionally layer 4 in combination with layer 6).

We have also demonstrated an advantage to propagating the fracture along the surface of a Si<001> substrate in any of the four ([100], [−100], [010], [0−10]) directions (orthogonal to the cleavage directions [110]). Fracture along these directions are much smoother and more consistent.

Thus, in one embodiment of the invention we deposit layer 6 (and optionally layer 4 in combination with layer 6) less than about 10 um, but more than about 3 um of a metal, e.g., a metal comprising Ni on a source substrate 2, stick the tape 8 (i.e., handle layer 8) on the surface of the metal, and pull off the surface layers 14, 6 (and optionally layer 4 in combination with layer 6) and 8. This works well on substrates comprising GaAs, Si, and Ge, as well as all substrates having crystal orientation <100> and <111>, although there is a pronounced improvement when using <111> oriented wafers (natural fracture plane) The improvements comprise smoother surfaces and thinner Ni layers for a given Ni stress value due to the reduced $K_{IC}$ on the natural fracture planes.

The invention in another embodiment further comprises a method comprising:

providing a source substrate having a surface;

disposing on the source substrate having a surface, a layer comprising a stress layer, the stress layer having a stress layer surface area in contact with and bonded to the surface of the source substrate;

operatively associating a handle foil with the stress layer; and applying force to the handle foil to separate the stress layer from the source substrate, and leave on the stress layer surface a portion of the source substrate substantially corresponding to the area in contact with the surface of the source substrate, the portion being less thick than the source layer;

wherein the stress layer comprises a stress layer or layers extending from and operatively associated with the source substrate, wherein the stress layer or layers comprise at least one optional adhesion layer that forms an interface with the source substrate comprising at least one of Ti/W, Ti, Cr, or Ni, operatively associated with at least one metal stress layer comprising Ni, Cr, and Fe which is opposite the interface. In another embodiment we provide a fracture plane below the surface of the source substrate, where the fracture plane may comprises a layer of material of different chemical composition than the source substrate; a strained epitaxial layer buried beneath the surface of the source substrate; or a strained hydrogenated layer buried beneath the surface of the source substrate such as a strained hydrogenated layer comprising a hydrogenated SiGe alloy grown on the source substrate where the source substrate comprises a Si substrate. In the latter embodiment the SiGe alloy includes boron to improve hydrogen trapping.

In another embodiment, the invention comprises:

providing a source substrate having a surface;

disposing on the source substrate having a surface, a layer comprising a stress layer, the stress layer having a stress layer surface area in contact with and bonded to the surface of the source substrate;

operatively associating a handle foil with the stress layer; and applying force to the handle foil to separate the stress layer from the source substrate, and leave on the stress layer surface a portion of the source substrate substantially corresponding to the area in contact with the surface of the source substrate, the portion being less thick than the source layer;

wherein the source substrate comprises an inorganic single crystal or polycrystalline material;

and wherein the source substrate comprises a Si Si<001>substrate arranged so that the force applied to the handle foil propagates a fracture along the surface of the Si<001>substrate in any of the four [100], [-100], [010], [0-10] directions, orthogonal to the cleavage directions [110] to make the fracture smoother and more consistent than fracture in other directions.

A further embodiment of the invention comprises:

providing a source substrate having a surface;

disposing on the source substrate having a surface, a layer comprising a stress layer, the stress layer having a stress layer surface area in contact with and bonded to the surface of the source substrate;

operatively associating a handle foil with the stress layer; and applying force to the handle foil to separate the stress layer from the source substrate, and leave on the stress layer surface a portion of the source substrate substantially corresponding to the area in contact with the surface of the source substrate, the portion being less thick than the source layer;

wherein the source substrate comprises an inorganic single crystal or polycrystalline material comprising a thin film direct or indirect bandgap semiconductor active solar cell thin film device positioned on the stress layer, and wherein the stress layer comprises a flexible material, to thereby provide a light weight and portable photovoltaic device resistant to humidity, heat, and outdoor environmental conditions.

Throughout this specification, abstract of the disclosure, and in the drawings, the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Although we employ the term "force," which is the product of mass multiplied by acceleration, we intend, for the purpose of this invention, to use the term "force" broadly to also include torque, or pressure, i.e., any mechanical effort or any type of mechanical energy applied to the layers to effect peeling where the force is applied by any prime mover known in the art such as an electric motor, or a heat engine, or fluid activated piston and cylinder means, or human effort, where the prime mover may be directly connected to or operatively associated with the layers or layer to be peeled, or connected or operatively associated with the layers or layer to be peeled through mechanical means comprising a rotating drum, or wheel, or lever, or wedge, or rack and pinion, or cylinder and piston means, and the art-known equivalents thereof, especially mechanical means that produce a mechanical advantage.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" in any claim or as applied to any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, compositions, or conditions, and the like specified herein, wherein "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Applicants reserve the right to amend this specification and the drawings filed herein without prejudice or disclaimer and in doing so, they do not disclaim, abandon, or forfeit any invention directly or indirectly represented thereby, and hereby rescind any implied disclaimer that may be inferred from applicants' amendments or cancellation in the course of prosecution of this or any parent, continuation, continuing, continuation in part, divisional, terminally disclaimed, or foreign patent application (related patent application or applications), and specifically preserve all and any inventions embodied not only by the original claims but also the written description, abstract of the disclosure, and drawings of this application and any related patent application or applications, and preserve the right to prosecute claims to these inventions in any related patent application or applications filed prior to or subsequent to the filing of this application.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A method comprising:

providing a source substrate having a surface;

disposing on said source substrate having a surface, a layer comprising a stress layer, said stress layer having a stress layer surface area in contact with and bonded to said surface of said source substrate;

operatively associating a handle foil with said stress layer; and applying force to said handle foil to separate said stress layer from said source substrate, and leave on said stress layer surface a portion of said source substrate substantially corresponding to said area in contact with said surface of said source substrate, said portion being less thick than said source layer;

wherein said stress layer comprises a stress layer or layers extending from and operatively associated with said source substrate, wherein said stress layer or layers comprise at least one optional adhesion layer that forms an interface with said source substrate comprising at least one of Ti/W, Ti, Cr, or Ni, operatively associated with at least one metal stress layer comprising Ni, Cr, and Fe which is opposite said interface.

2. A method comprising:

providing a source substrate having a surface;

providing a fracture plane below the surface of said source substrate;

disposing on said source substrate, a layer comprising a stress layer, said stress layer having a stress layer surface area in contact with and bonded to said surface of said source substrate;

operatively associating a handle foil with said stress layer; and applying force to said handle foil to separate said stress layer from said source substrate, and leave on said stress layer surface a portion of said source substrate substantially corresponding to said area in contact with said surface of said source substrate, said portion being less thick than said source layer wherein said fracture plane comprises a layer of material of different chemical composition than said source substrate.

3. A method comprising:

providing a source substrate having a surface;

providing a fracture plane below the surface of said source substrate;

disposing on said source substrate, a layer comprising a stress layer, said stress layer having a stress layer surface area in contact with and bonded to said surface of said source substrate;

operatively associating a handle foil with said stress layer; and applying force to said handle foil to separate said stress layer from said source substrate, and leave on said stress layer surface a portion of said source substrate substantially corresponding to said area in contact with said surface of said source substrate, said portion being less thick than said source layer wherein said fracture plane comprises a strained epitaxial layer buried beneath the surface of said source substrate.

4. A method comprising:

providing a source substrate having a surface;

providing a fracture plane below the surface of said source substrate;

disposing on said source substrate, a layer comprising a stress layer, said stress layer having a stress layer surface area in contact with and bonded to said surface of said source substrate;

operatively associating a handle foil with said stress layer; and applying force to said handle foil to separate said stress layer from said source substrate, and leave on said stress layer surface a portion of said source substrate substantially corresponding to said area in contact with said surface of said source substrate, said portion being less thick than said source layer wherein said fracture plane comprises a strained hydrogenated layer buried beneath the surface of said source substrate.

5. A method according to claim 4 wherein said fracture plain comprises a strained hydrogenated layer buried beneath the surface of said source substrate, said strained hydrogenated layer comprising a hydrogenated SiGe alloy grown on said source substrate where said source substrate comprises a Si substrate.

6. A method according to claim 5 wherein said SiGe alloy includes boron to improve hydrogen trapping.

7. A method comprising:

providing a source substrate having a surface;

disposing on said source substrate having a surface, a layer comprising a stress layer, said stress layer having a stress layer surface area in contact with and bonded to said surface of said source substrate;

operatively associating a handle foil with said stress layer; and applying force to said handle foil to separate said stress layer from said source substrate, and leave on said stress layer surface a portion of said source substrate substantially corresponding to said area in contact with said surface of said source substrate, said portion being less thick than said source layer;

wherein said source substrate comprises an inorganic single crystal or polycrystalline material;

and wherein said source substrate comprises a Si Si<001> substrate arranged so that said force applied to said handle foil propagates a fracture along the surface of said Si<001> substrate in any of the four [100], [−100], [010], [0−10] directions, orthogonal to the cleavage directions [110] to make the fracture smoother and more consistent than fracture in other directions.

8. A method comprising:

providing a source substrate having a surface;

disposing on said source substrate having a surface, a layer comprising a stress layer, said stress layer having a stress layer surface area in contact with and bonded to said surface of said source substrate;

operatively associating a handle foil with said stress layer; and applying force to said handle foil to separate said stress layer from said source substrate, and leave on said stress layer surface a portion of said source substrate substantially corresponding to said area in contact with said surface of said source substrate, said portion being less thick than said source layer;

wherein said source substrate comprises an inorganic single crystal or polycrystalline material comprising a thin film direct or indirect bandgap semiconductor active solar cell thin film device positioned on said stress layer, and wherein said stress layer comprises a flexible material, to thereby provide a light weight and portable photovoltaic device resistant to humidity, heat, and outdoor environmental conditions.

* * * * *